(12) United States Patent
Masui et al.

(10) Patent No.: US 8,027,370 B2
(45) Date of Patent: Sep. 27, 2011

(54) SEMICONDUCTOR DEVICE

(75) Inventors: Yuji Masui, Kanagawa (JP); Takahiro Arakida, Kanagawa (JP); Kayoko Kikuchi, Kanagawa (JP); Terukazu Naruse, Kanagawa (JP); Tomoyuki Oki, Kanagawa (JP); Naoki Jogan, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/656,165

(22) Filed: Jan. 20, 2010

(65) Prior Publication Data

US 2010/0202482 A1 Aug. 12, 2010

(30) Foreign Application Priority Data

Feb. 6, 2009 (JP) .................................. 2009-026673

(51) Int. Cl.
*H01S 5/00* (2006.01)
*H01S 3/13* (2006.01)
(52) U.S. Cl. ............ 372/50.124; 372/46.01; 372/29.013
(58) Field of Classification Search ............. 372/50.124, 372/29.013, 46.01
See application file for complete search history.

(56) References Cited

U.S. PATENT DOCUMENTS

| 6,822,993 | B2 * | 11/2004 | Lee et al. ............... 372/46.015 |
| 7,416,930 | B2 | 8/2008 | Lee et al. |
| 2005/0161687 | A1 * | 7/2005 | Kaneko .......................... 257/94 |
| 2008/0279241 | A1 * | 11/2008 | Oki et al. ................... 372/45.01 |

FOREIGN PATENT DOCUMENTS

| JP | 59-035437 | 2/1984 |
| JP | 01-308036 | 12/1989 |
| JP | 2006-173626 | 6/2006 |
| JP | 2006-190762 | 7/2006 |
| JP | 2006-294885 | 10/2006 |
| JP | 2007-059673 | 3/2007 |

* cited by examiner

*Primary Examiner* — Jessica Stultz
*Assistant Examiner* — Phillip Nguyen
(74) *Attorney, Agent, or Firm* — Rader, Fishman & Grauer PLLC

(57) ABSTRACT

The present invention provides a semiconductor device realizing improved adhesion between a low-dielectric-constant material and a semiconductor material. The semiconductor device includes, on a semiconductor layer, an adhesion layer and a low-dielectric-constant material layer in order from the semiconductor layer side. The adhesion layer has a projection/recess structure, and the low-dielectric-constant material layer is formed so as to bury gaps in the projection/recess structure.

7 Claims, 7 Drawing Sheets

SEMICONDUCTOR DEVICE

BACKGROUND OF THE INVENTION

1. Field of the Invention

The present invention relates to a semiconductor device provided with improved adhesion between a low-dielectric-constant material and a semiconductor.

2. Description of the Related Art

Power consumption of a vertical cavity surface emitting laser (VCSEL) is lower than that of an edge-emitting laser diode, and the VCSEL is possible to be directly modulated. Therefore, the VCSEL is used as a cheap light source for optical communication in recent years.

A VCSEL, generally, has a columnar mesa in which a lower DBR layer, a lower spacer layer, an active layer, an upper spacer layer, an upper DBR layer, and a contact layer are stacked in this order on a substrate. Either the lower DBR layer or the upper DBR layer is provided with a current narrowing layer having a structure that a current injection region is narrowed in order to increase the efficient of injecting current to the active layer and to decrease threshold current. An electrode is provided for each of the top face of the mesa and the rear face of the substrate. In the VCSEL, current injected from the electrode is narrowed by the current narrowing layer and then injected to the active layer, thereby generating light by recombination of electrons and holes. The light is reflected by the lower DBR layer and the upper DBR layer, laser oscillation occurs at a predetermined wavelength, and the resultant light is emitted as a laser beam from the top of the mesa.

The diameter of the mesa is at most tens and the area of the electrode on the mesa is extremely narrow. Due to this, an electrode pad for wire bonding, which is electrically connected to the electrode on the mesa is formed around the mesa. However, parasitic capacitance is generated between the electrode pad and the lower DBR layer. For direct modulation at high speed, the parasitic capacitance has to be suppressed, and a device such as insertion of a low-dielectric-constant material below the electrode pad is necessary.

The characteristics necessary for the low-dielectric-constant material are the following three points: (1) excellent heat resistance and moisture resistance at low dielectric constant, (2) easy formation of a thick film by spin coating or the like, and (3) easy patterning. Polyimide is a representative low-dielectric-constant material having all of the characteristics and is a common material formed below the electrode pad and a wiring in order to reduce parasitic capacitance.

SUMMARY OF THE INVENTION

Generally, in the case of forming a shape by polyimide, polyimide is applied in a state where polyamide acid as a precursor is dissolved on a semiconductor layer or an insulating layer, patterned, and dried and cured (imidized) at a high temperature of 300° C. or higher. During the curing, polyimide expands or contracts (in many cases, contracts). Consequently, the formed polyimide entails distortion. In addition, the thermal expansion coefficient of polyimide is different from that of a semiconductor layer and that of an insulating layer, so that there is case that a crack or peeling occurs in a subsequent process. There is also a case that a crack or peeling is caused by ultrasonic waves applied at the time of bonding a wire to the electrode pad.

Various methods to improve adhesion of an electrode have been proposed. For example, in Japanese Unexamined Patent Application Publication No. SHO59-35437, by providing the insulating layer below the electrode with a rough structure, the adhesion strength between the electrode and the insulating layer is improved. In Japanese Unexamined Patent Application Publication No. H01-308036, a method of partly cutting an insulating layer and a semiconductor substrate below an electrode to reduce parasitic capacitance is proposed. However, a general method of improving adhesion between a low-dielectric-constant material such as polyimide and a semiconductor material is not proposed.

It is desirable to provide a semiconductor device realizing improved adhesion between a low-dielectric-constant material and a semiconductor material.

According to an embodiment of the invention, there is provided a semiconductor device including, on a semiconductor layer, an adhesion layer and a low-dielectric-constant material layer in order from the semiconductor layer side. The adhesion layer has a projection/recess structure, and the low-dielectric-constant material layer is formed so as to bury gaps in the projection/recess structure.

In the semiconductor device of an embodiment of the invention, the adhesion layer having the projection/recess structure is provided between the semiconductor layer and the low-dielectric-constant material layer, and a low-dielectric-constant material layer is formed so as to bury the projection/recess structure of the adhesion layer. With the configuration, contact area between the adhesion layer and the low-dielectric-constant material layer increases.

According to the semiconductor device of an embodiment of the invention, the contact area between the adhesion layer provided between the semiconductor layer and the low-dielectric-constant material layer and the low-dielectric-constant material layer increases, so that the low-dielectric-constant material layer does not easily peel off from the adhesion layer. Therefore, adhesion between the low-dielectric-constant material and the semiconductor may be improved.

Other and further objects, features and advantages of the invention will appear more fully from the following description.

DETAILED DESCRIPTION OF THE PREFERRED EMBODIMENTS

Figure 1:
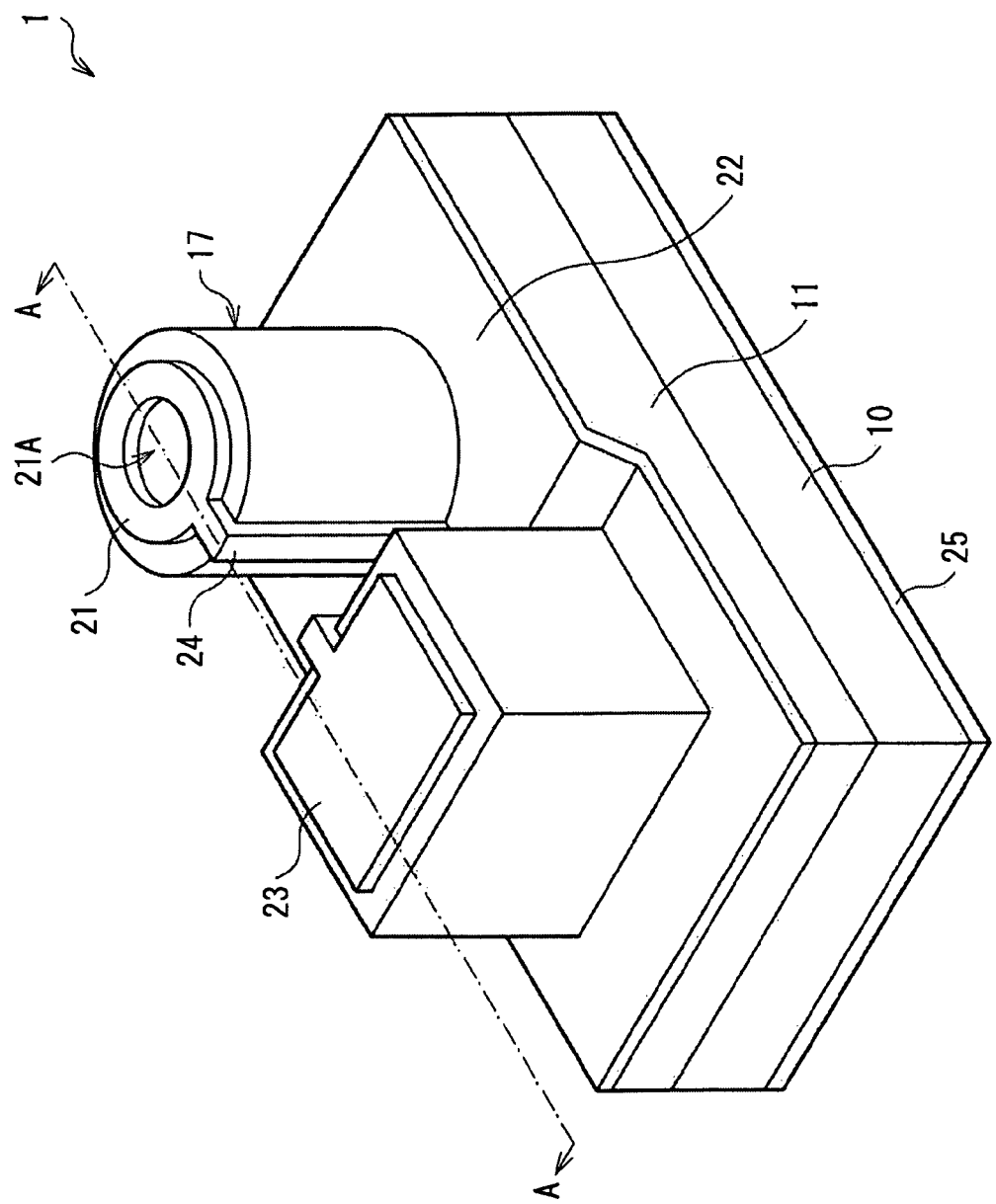
FIG. 1 is a perspective view of a laser diode according to an embodiment of the present invention.
Figure 2:
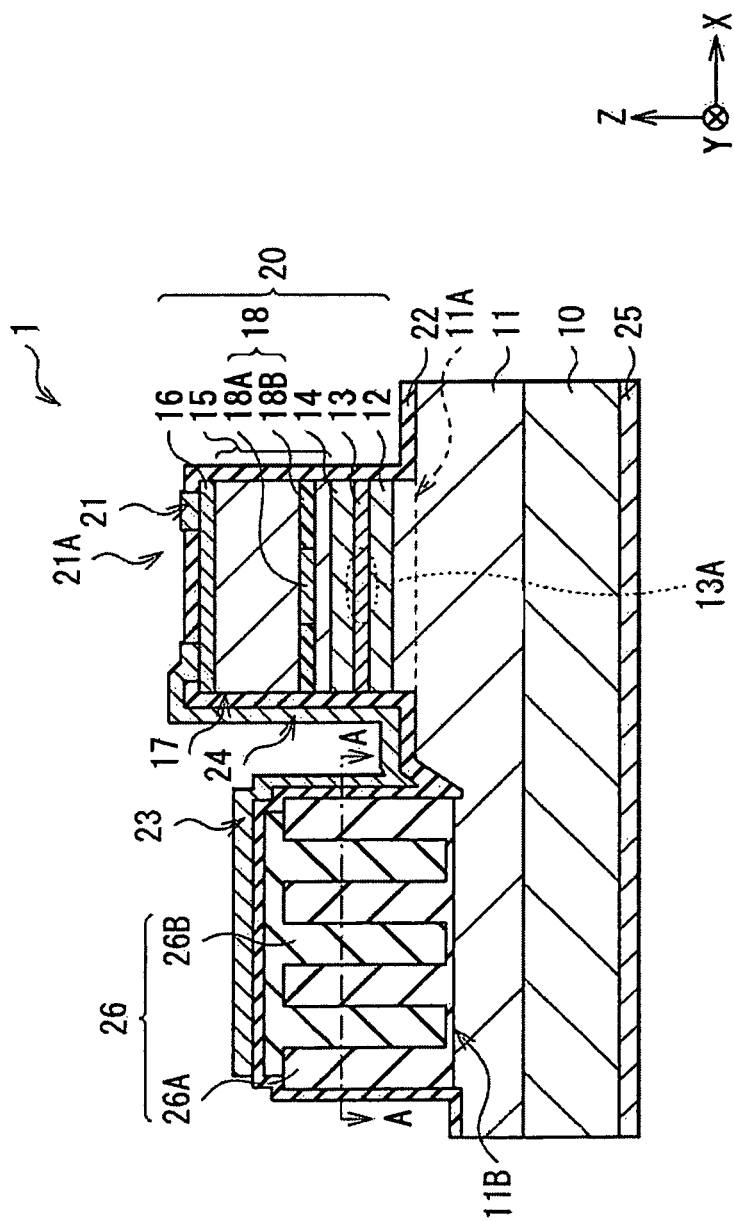
FIG. 2 is a cross section taken along line A-A of the semiconductor device illustrated in FIG. 1.

Modes for carrying out the invention will be described in detail below with reference to the drawings. The description will be given in the following order.
1. Configuration
2. Manufacturing Method
3. Action and effect
4. Modification Configuration FIG. 1 is a perspective view of a laser diode 1 of a vertical cavity surface emitting type according to an embodiment of the present invention. FIG. 2 illustrates an example of the sectional configuration taken along line A-A of the laser diode 1 of FIG. 1. FIGS. 1 and 2 are schematic views, and dimensions and shapes in FIGS. 1 and 2 are different from actual ones.

The laser diode 1 of the embodiment has a stacked structure 20 in which a lower DBR layer 11, a lower spacer layer 12, an active layer 13, an upper spacer layer 14, an upper DBR layer 15, and a contact layer 16 are stacked in order on one face side of a substrate 10. In an upper part of the stacked structure 20, concretely, in a part of the lower DBR layer 11 and in the lower spacer layer 12, the active layer 13, the upper spacer layer 14, the upper DBR layer 15, and the contact layer 16, a columnar mesa 17 having, for example, a width of about 30 μm is formed.

In the embodiment, the lower DBR layer 11 corresponds to a concrete example of a "semiconductor layer" and a "first multilayer reflector" of the invention. The upper DBR layer 15 corresponds to a concrete example of a "second multilayer reflector" of the invention. The stacked structure 20 corresponds to a concrete example of a "resonator structure" of the invention.

The substrate 10 is, for example, an n-type GaAs substrate. Examples of n-type impurity are silicon (Si) and selenium (Se). The stacked structure 20 is made of, for example, an AlGaAs-based compound semiconductor. The AlGaAs-based compound semiconductor is a compound semiconductor including at least aluminum (Al) and gallium (Ga) in the elements of group 3B in the short periodical table, and at least arsenic (As) in the elements of group 5B in the short periodical table.

The lower DBR layer 11 is formed by alternately stacking a low-refractive-index layer (not illustrated) and a high-refractive-index layer (not illustrated). The low-refractive-index layer is made of, for example, n-type $Al_{x1}Ga_{1-x1}As$ (0<x1<1) having a thickness of $\lambda_0/4_{n1}$ ($\lambda_0$ is oscillation wavelength and $n_1$ denotes refractive index). The high-refractive-index layer is made of, for example, n-type $Al_{x2}Ga_{1-x2}As$ (0<x2<x1) having a thickness of $\lambda_0/4_{n2}$ ($n_2$ denotes refractive index).

The lower spacer layer 12 is made of, for example, n-type $Al_{x3}Ga_{1-x3}As$ (0<x3<1). The active layer 13 is made of, for example, undoped $Al_{x4}Ga_{1-x4}As$ (0<x4<1). In the active layer 13, a region opposed to a current injection region 18A which will be described later is a light emission region 13A. The upper spacer layer 14 is made of, for example, p-type $Al_{x5}Ga_{1-x5}As$ (0≦x5<1). Examples of the p-type impurity are zinc (Zn), magnesium (Mg), and beryllium (Be).

The upper DBR layer 15 is formed by alternately stacking a low-refractive-index layer (not illustrated) and a high-refractive-index layer (not illustrated). The low-refractive-index layer is made of, for example, p-type $Al_{x6}Ga_{1-x6}As$ (0<x6<1) having a thickness of $\lambda_0/4_{n3}$ ($n_3$ denotes refractive index). The high-refractive-index layer is made of, for example, p-type $Al_{x7}Ga_{1-x7}As$ (0<x7<x6) having a thickness of $\lambda_0/4_{n4}$ ($n_4$ denotes refractive index). The contact layer 16 is made of, for example, p-type $Al_{x8}Ga_{1-x8}As$ (0<x8<1).

In the laser diode 1, for example, a current narrowing layer 18 is provided in the upper DBR layer 15. The current narrowing layer 18 is provided in place of the low-refractive-index layer in the portion of the low-refractive-index layer apart from the active layer 13 side by, for example, a few layers in the upper DBR layer 15. The current narrowing layer 18 has a current narrowing region 18B in the peripheral region of the layer and has the current injection region 18A in the center region of the layer. The current injection region 18A is made of, for example, p-type $Al_{x9}Ga_{1-x9}As$ (0<x9≦1). The current narrowing region 18B is made of, for example, aluminum oxide ($Al_2O_3$) and, as will be described later, is obtained by oxidizing high-concentration Al contained in a layer 18D to be oxidized from a side. Consequently, the current narrowing layer 18 has a function of narrowing current. The current narrowing layer 18 may be formed, for example, in the lower DBR layer 11, between the lower spacer layer 12 and the lower DBR layer 11, or between the upper spacer layer 14 and the upper DBR layer 15.

On the top face of the mesa 17 (the top face of the contact layer 16), an annular-shaped top electrode 21 having an aperture (light emitting port 21A) in a region opposed to the current injection region 18A is formed. An insulating layer 22 is formed on side faces and the surface of the periphery of the mesa 17. On the surface of the insulating layer 22, an electrode pad 23 for bonding a wire (not illustrated) and a connection part 24 are provided. The electrode pad 23 and the top electrode 21 are electrically connected to each other via the connection part 24. A bottom electrode 25 is provided on the rear side of the substrate 10.

The insulating layer 22 is made of an insulating material such as oxide or nitride. The top electrode 21, the electrode pad 23, and the connection part 24 are obtained by stacking, for example, titanium (Ti), platinum (Pt), and gold (Au) in this order, and are electrically connected to the contact layer 16 on the mesa 17. The bottom electrode 25 has a structure obtained by stacking, for example, an alloy of gold (Au) and germanium (Ge), nickel (Ni), and gold (Au) in order from the substrate 10 side, and is electrically connected to the substrate 10.

In the embodiment, for example, as illustrated in FIG. 2, a base 26 is provided just below the electrode pad 23. The base 26 is formed between the foot of the mesa 17 (a no-formation region of the mesa 17) in the lower DBR layer 11 and the insulating layer 22. The base 26 is formed, for example, as illustrated in FIG. 2, in a part (11B) lower than a formation part (11A) of the mesa 17. The base 26 has a projection/recess part 26A and a burying part 26B.

In the embodiment, the projection/recess part 26A corresponds to a concrete example of an "adhesion layer" of the present invention. The burying part 26B corresponds to a concrete example of a "low-dielectric-constant material layer" of the present invention.

Figure 3A:
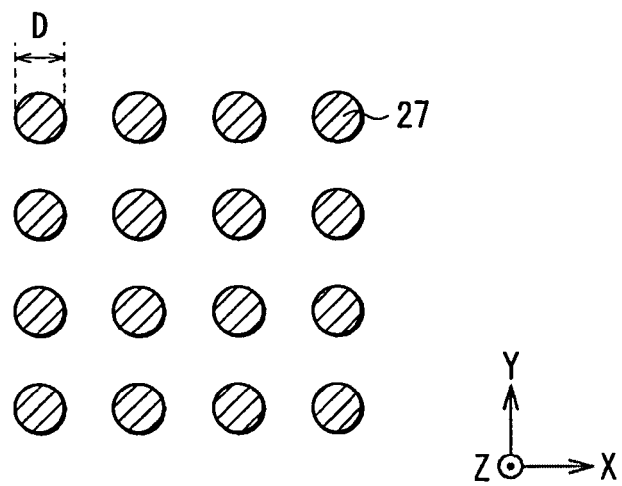
FIGS. 3A to 3C are cross sections of a projection part 26A in FIG. 1.

FIG. 3A illustrates an example of a sectional configuration taken along line A-A of the laser diode 1 of FIG. 2 while omitting the burying part 26B and the insulating layer 22. The projection/recess part 26A is formed in contact with the lower DBR layer 11 and is formed integrally (continuously) with the lower DBR layer 11. As illustrated in FIG. 3A, for example, the projection/recess part 26A has a projection structure in which a plurality of columnar projections 27 are disposed at predetermined intervals. The projections 27 are preferably coupled to each other at the bottom of the projection/recess part 26A. Preferably, the projection/recess part 26A does not have an aperture which comes into contact with the part just below the projection/recess part 26A in the lower DBR layer 11. That is, preferably, the projection/recess part 26A spatially isolates the burying part 26B and the lower DBR layer 11.

Figure 3B:
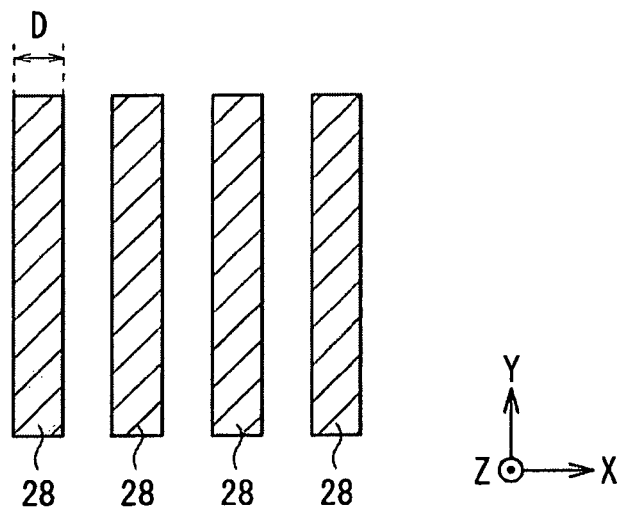
Figure 3C:
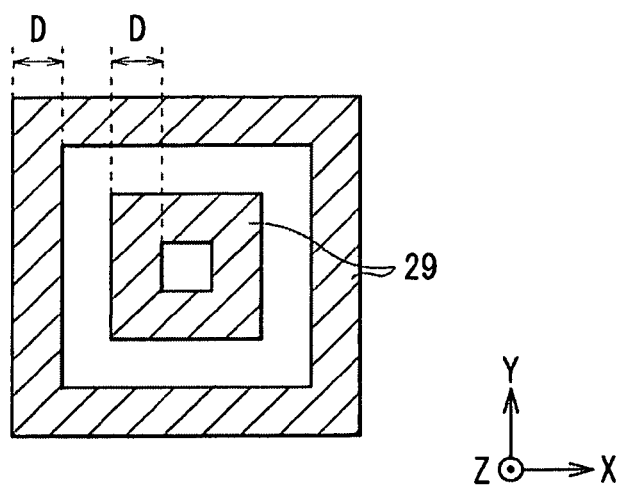

The projection/recess part 26A may have a projection structure other than the structure illustrated in FIG. 3A. FIGS. 3B and 3C illustrate other examples of the sectional configuration taken along line A-A of the laser diode 1 of FIG. 2 while omitting the burying part 26B and the insulting layer 22. The projection/recess part 26A may have a projection structure in which a plurality of plate-shape projections 28 extending in a plane parallel to the substrate 10 are disposed at predetermined intervals. Preferably, the projections 28 are coupled to each other on the bottom of the projection/recess part 26A. The projection/recess part 26A may have, for example, as illustrated in FIG. 3C, a projection structure in which a plurality of annular projections 29 extending in a plane parallel to the substrate 10 are disposed concentrically at predetermined intervals. The projections 29 are preferably coupled to each other on the bottom of the projection/recess part 26A.

The projection/recess part 26A is made of an insulating oxide semiconductor. The projection/recess part 26A is formed by, as described above, forming the lower DBR layer 11, the lower spacer layer 12, the active layer 13, the upper spacer layer 14, and the upper DBR layer 15 in a projection/recess structure by selective etching and, after that, oxidizing the projection/recess structure from side faces. The projection/recess structure corresponds to a projection/recess part 26D (refer to FIG. 5A) which will be described later.

Width D of the projection/recess part 26A (refer to FIGS. 3A to 3C) is preferably set to a degree that the entire projection/recess part 26A may be oxidized (insulated) in an oxidizing process which will be described later. The width D is, for example, preferably, equal to or less than the half of the width of the mesa 17 (for example, 10 μm or less). With such a configuration, the projection/recess part 26D is allowed to be oxidized simultaneously with the layer 18D to be oxidized, and the manufacturing process is simplified. The projection/recess part 26A is preferably as tall as possible from the viewpoint of reducing the parasitic capacitance generated by the electrode pad 23 and the lower. DBR layer 11, and preferably has a height equal to that of the mesa 17. The height of the projection/recess part 26A is, for example, about 0.1 μm to 5 μm.

The burying part 26B is formed between the projection/recess part 26A and the insulting layer 22 so as to be in contact with the projection/recess part 26A and the insulating layer 22. The burying part 26B is formed so as to bury the gaps in the projection/recess part 26A, and the top face of the burying part 26B is a flat face. The burying part 26B is made of an insulting low-dielectric-constant material. As the insulating low-dielectric-constant material used for the burying part 26B, for example, a material which easily buries the gaps in the projection/recess part 26D by spin coating or the like and which is easily patterned is preferable. It is also important that the insulating low-dielectric-constant material has high heat resistance and high moisture resistance. Examples of the insulting low-dielectric-constant material having all of such characteristics are polyimide, BCB resin (benzocyclobutene), and the like.

Manufacturing Method

For example, the laser diode 1 of the embodiment may be manufactured as follows.

FIGS. 4A and 4B to FIGS. 6A and 6B illustrate the manufacturing method in process order. Each of FIGS. 4A and 4B to FIGS. 6A and 6B is a cross section taken along line A-A of FIG. 1, illustrating the configuration of a device in a manufacturing process.

A compound semiconductor layer on the substrate 10 made of GaAs is formed by, for example, MOCVD (Metal Organic Chemical Vapor Deposition). As the material of a III-V group compound semiconductor, for example, trimethyl aluminum (TMA), trimethyl gallium (TMG), trimethyl indium (TMIn), or arsine (AsH3) is used. As the material of donor impurity, for example, H$_2$Se is used. As the material of acceptor impurity, for example, dimethyl zinc (DMZ) is used.

Figure 4A:
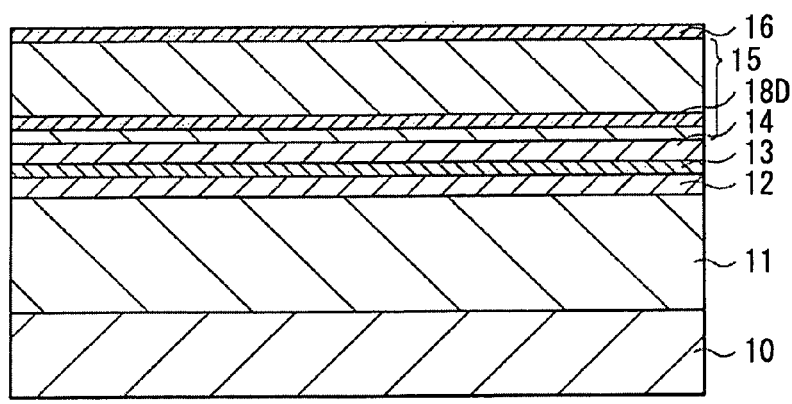
FIGS. 4A and 4B are cross sections for explaining a process of manufacturing the laser diode of FIG. 1.

Concretely, first, on the substrate 10, the lower DBR layer 11, the lower spacer layer 12, the active layer 13, the upper spacer layer 14, the upper DBR layer 15, and the contact layer 16 are stacked in this order (FIG. 4A). At this time, the layer 18D to be oxidized is formed in a part of the upper DBR layer 15. The layer 18D to be oxidized is a layer which is oxidized in a oxidizing process to be described later to become the current narrowing layer 18, and contains, for example, AlAs.

Figure 4B:
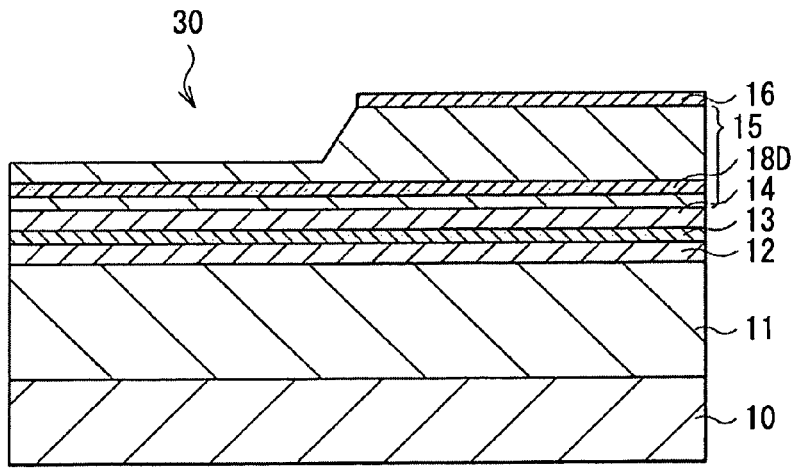

Next, on the surface of the contact layer 16, a resist layer (not illustrated) having an aperture corresponding to a region where the electrode pad 23 is to be formed in a later process is formed. Subsequently, for example, by reactive ion etching (RIE), the contact layer 16 and the upper DBR layer 15 are selectively removed using the resist layer as a mask. The etching is stopped just before reaching the layer 18D to be oxidized. As a result, a step 30 is formed in a region where the projection/recess part 26D is to be formed in a later process (FIG. 4B). After that, the resist layer is removed.

Next, a circular resist layer (not illustrated) having a diameter equal to that of the mesa 17 is formed on the surface of the contact layer 16. Further, a resist layer (not illustrated) having a pattern similar to that of the base 26 illustrated in FIGS. 3A to 3C is formed on the surface of a part exposed by the preceding process in the upper DBR layer 15. At this time, the width of the pattern is set to, for example, the half of the diameter of the mesa 17 or less in consideration of oxidization rate in the oxidizing process to be described later.

Figure 5A:
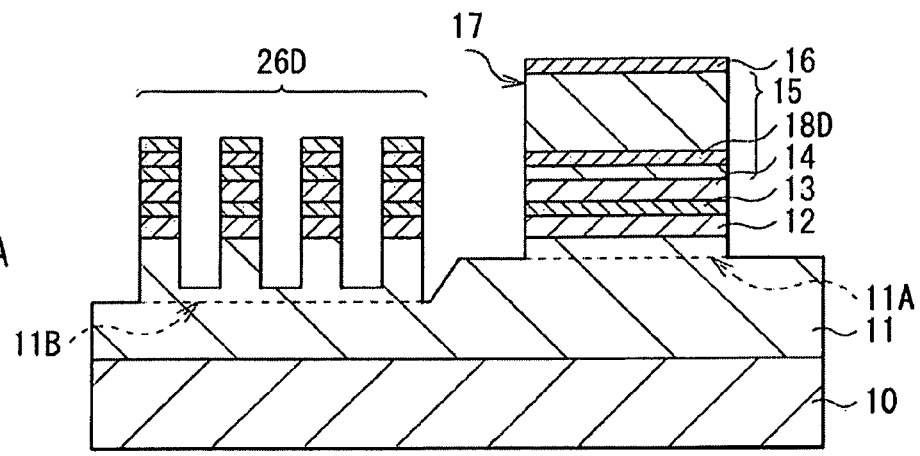
FIGS. 5A and 5B are cross sections for explaining a process subsequent to FIG. 4B.

Next, for example, by RIE, using the resist layer as a mask, a part of the lower DBR layer 11, the lower spacer layer 12, the active layer 13, the upper spacer layer 14, the upper DBR layer 15, the contact layer 16, and the layer 18D to be oxidized are selectively removed (FIG. 5A). By the operation, the mesa 17 is formed just below the circular-shaped resist layer. At this time, the layer 18D to be oxidized is exposed from the side faces of the mesa 17. Just below the resist layer having a pattern similar to that of the base 26 illustrated in FIGS. 3A to 3C, the projection/recess part 26D having a shape in which the pattern is reflected is formed. The projection/recess part 26D is formed in the part (11B) lower than the part (11A) where the mesa 17 is formed. After that, the resist layer is removed. The mesa 17 and the projection/recess part 26D may be formed simultaneously or separately.

Figure 5B:
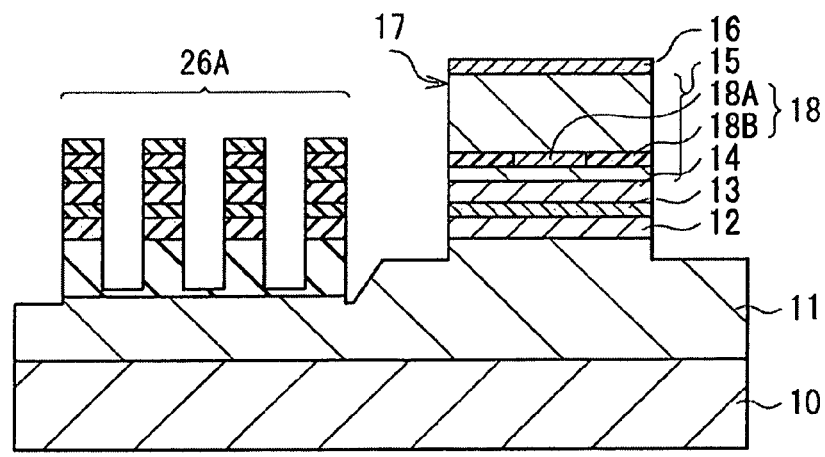

Next, the oxidizing process is performed at high temperature in water-vapor atmosphere to selectively oxidize Al included in the layer 18D to be oxidized from the side faces of the mesa 17 and selectively oxidize Al included in the projection/recess part 26D. By the oxidization, the outer edge region of the layer 18D to be oxidized becomes an insulating layer (aluminum oxide) and the current narrowing layer 18 is formed (FIG. 5B). Further, the projection/recess part 26D narrower than the current narrowing layer 18 is completely oxidized, thereby forming the insulating projection/recess part 26A (FIG. 5B).

Figure 6A:
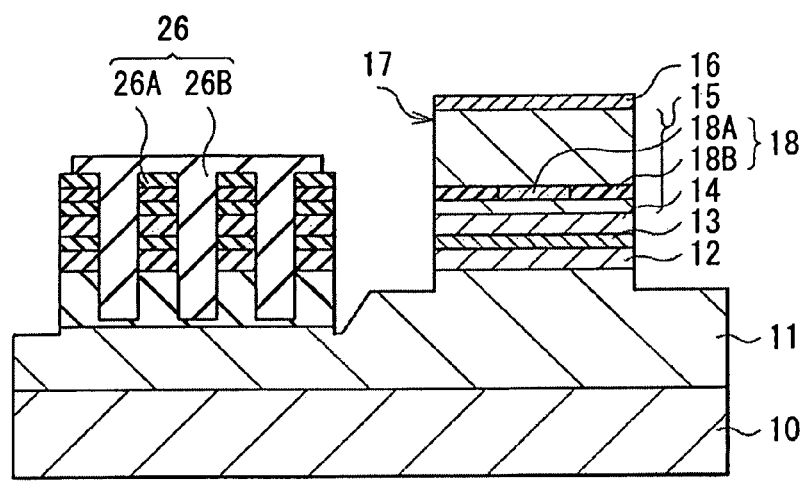
FIGS. 6A and 6B are cross sections for explaining a process subsequent to FIG. 5.

Next, for example, by spin coating, a photosensitive resin material such as photosensitive polyimide is applied on the entire surface including the top face of the projection/recess part 26A. The photosensitive resin material is applied to a degree that the gaps in the projection/recess part 26A are buried and the surface becomes almost flat. Next, by patterning, only a part corresponding to the top face of the projection/recess part 26A in the applied photosensitive resin material is left. The left part is dried and solidified. The insulating burying part 26B is formed on the top face of the projection/recess part 26A and, as a result, the base 26 is formed (FIG. 6A).

Figure 6B:
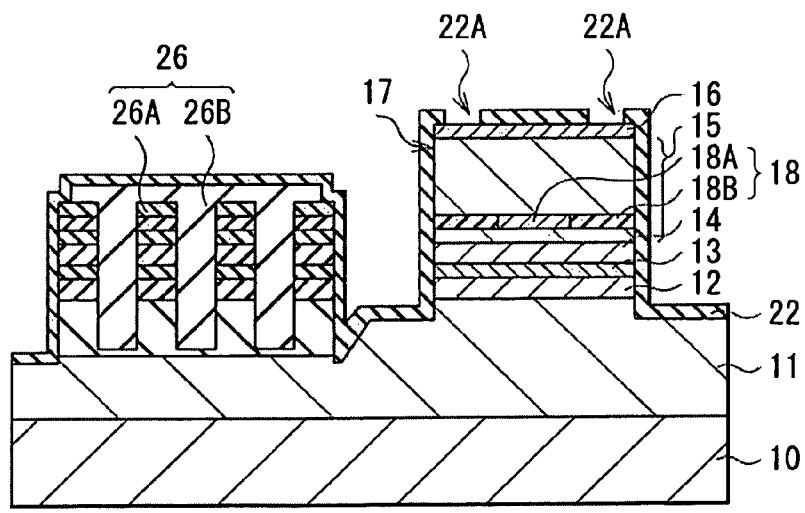

Next, on the entire surface, for example, the insulating layer 22 made of an insulating inorganic material such as silicon oxide (SiO$_2$) is formed (FIG. 6B). Subsequently, a resist layer (not illustrated) having an annular aperture is formed on the top face of the mesa 17 and, after that, the insulating layer 22 is selectively removed using the resist layer as a mask by, for example, RIE. By the operation, the aperture 22A is formed in a part where the top electrode 21 is to be formed (FIG. 6B). After that, the resist layer is removed.

Next, for example, by vacuum deposition, the above-described metal materials are stacked on the entire surface. After that, for example, by selective etching, the annular top electrode 21 is formed so as to bury the aperture 22A, the electrode pad 23 is formed in a part just above the base 26 in the insulating layer 22 and, further, the connection part 24 is formed between them (FIG. 2). Further, the rear face of the substrate 10 is properly polished to adjust the thickness of the substrate 10, and the bottom electrode 25 is formed on the rear face of the substrate 10 (FIG. 2). In such a manner, the laser diode 1 of the embodiment is manufactured.

The action and effect of the laser diode 1 of the embodiment will now be described.

Action and Effect

In the laser diode 1 of the embodiment, when a predetermined voltage is applied across the bottom electrode 25 and the top electrode 21, current is injected to the active layer 13 via the current injection region 18A in the current narrowing layer 18, and light is emitted by recombination of electrons and holes. The light is reflected by the pair of lower and upper DBR layers 11 and 15, laser oscillation is generated at a predetermined wavelength, and the light is emitted as a laser beam from the light emitting port 21A to the outside.

In the embodiment, the projection/recess part 26A having the projection/recess structure is provided between the lower DBR layer 11 made of semiconductor material and the burying part 26B made of the low-dielectric-constant material. Further, the burying part 26B is formed so as to bury the projection/recess structure of the projection/recess part 26A. As the contact area between the projection/recess part 26A and the burying part 26B becomes large, occurrence of a crack between the projection/recess part 26A and the burying part 26B is suppressed, and peeling-off of the burying part 26B from the projection/recess part 26A is suppressed. Since the projection/recess part 26A is formed integrally (continuously) with the lower DBR layer 11, in a normal process, a crack does not occur between the projection/recess part 26A and the lower DBR layer 11, and the projection/recess part 26A does not peel off from the lower DBR layer 11.

Consequently, a crack does not occur between the lower DBR layer 11 made of semiconductor material and the burying part 26B made of low-dielectric-constant material, and the burying part 26B does not peel off from the lower DBR layer 11. Therefore, as compared with the case where the insulating low-dielectric-constant material is in direct contact with the flat semiconductor material, adhesion between the semiconductor material and the low-dielectric-constant material is improved.

In the embodiment, the insulating base 26 is provided between the electrode pad 23 and the lower DBR layer 11. With the configuration, the magnitude of parasitic capacitance formed between the electrode pad 23 and the lower DBR layer 11 is reduced.

Modifications

Although the present invention has been described by the embodiment, the invention is not limited to the embodiment but may be variously modified.

Figure 7:
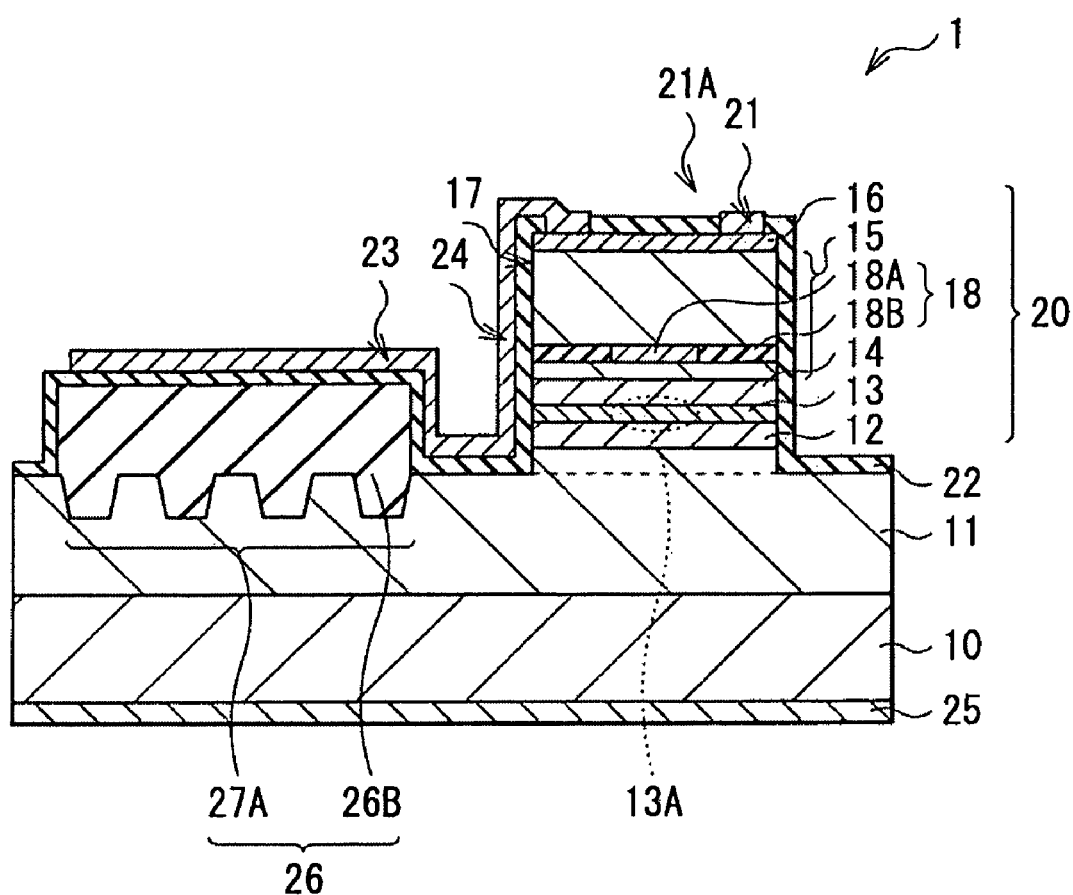
FIG. 7 is a cross section of a laser diode according to a modification.

For example, although the projection/recess part 26A is made of the insulating oxide semiconductor in the embodiment, it may be made of another material such as conductive semiconductor. In this case, for example, as illustrated in FIG. 7, a projection/recess part 27A provided in place of the projection/recess part 26A may be constructed by a part of the lower DBR layer 11. In this case, the projection/recess part 27A is made of the same material as that of the lower DBR layer 11. The projection/recess part 27A may have projections 27, 28, or 29 as illustrated in FIGS. 3A, 3B, and 3C.

Although the present invention has been described using the AlGaAs-based compound laser diode as an example in the foregoing embodiment, it is also applicable to another compound laser diode such as a laser diode made of compound semiconductor which is oxidizable. Although the case of applying the present invention to a VCSEL has been described, obviously, the invention is also applicable to another semiconductor device.

The present application contains subject matter related to that disclosed in Japanese Priority Patent Application JP 2009-026673 filed in the Japan Patent Office on Feb. 6, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising, on a semiconductor layer, an adhesion layer and a low-dielectric-constant material layer in order from the semiconductor layer side, further comprising:
   a resonator structure including a first multilayer reflector, an active layer, and a second multilayer reflector in order from the semiconductor layer side on the semiconductor layer and in a region different from the adhesion layer; and
   an electrode electrically connected to the second multilayer reflector on the low-dielectric-constant material layer,
   wherein the adhesion layer has a projection and recess structure, and
   the low-dielectric-constant material layer is formed so as to bury gaps in the projection and recess structure.

2. The semiconductor device according to claim 1, wherein the adhesion layer is made of oxide semiconductor.

3. The semiconductor device according to claim 2, wherein the adhesion layer is insulated by forming a stacked structure including the first multilayer reflector, the active layer, and the second multilayer reflector by selective etching into a projection and recess structure and oxidizing the structure.

4. The semiconductor device according to claim 1, wherein a part which is in contact with the adhesion layer, of the semiconductor layer is lower than a part which is in contact with the resonator structure in the semiconductor layer.

5. The semiconductor device according to claim 1, wherein the low-dielectric-constant material layer is made of polyimide.

6. The semiconductor device according to claim 1, wherein the adhesion layer is made of semiconductor.

7. The semiconductor device according to claim 6, wherein the adhesion layer is made of the same material as that of the semiconductor layer.

* * * * *